(12) United States Patent
Seshita

(10) Patent No.: US 8,816,740 B1
(45) Date of Patent: Aug. 26, 2014

(54) BUFFER CIRCUIT AND SWITCHING CONTROLLER

(71) Applicant: Kabushiki Kaisha Toshiba, Tokyo (JP)

(72) Inventor: Toshiki Seshita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/903,840

(22) Filed: May 28, 2013

(51) Int. Cl.
*H03K 3/3565* (2006.01)
(52) U.S. Cl.
CPC .................................. *H03K 3/3565* (2013.01)
USPC ............................. 327/205; 327/206; 327/404
(58) Field of Classification Search
CPC .................................................... H03K 3/3565
USPC ......... 327/551, 18, 50, 77, 80, 81, 85, 97, 99, 327/112, 170, 199, 205, 206, 207, 208, 210, 327/214, 215, 403, 404
See application file for complete search history.

(56) References Cited

U.S. PATENT DOCUMENTS

| 6,094,086 | A * | 7/2000 | Chow | 327/396 |
| 6,462,597 | B2 * | 10/2002 | Lee | 327/261 |
| 2008/0116952 | A1 * | 5/2008 | Kase et al. | 327/206 |
| 2010/0244907 | A1 * | 9/2010 | Gagne et al. | 327/109 |
| 2011/0050288 | A1 * | 3/2011 | Sagae et al. | 327/108 |

FOREIGN PATENT DOCUMENTS

JP          06-188714          7/1994

* cited by examiner

*Primary Examiner* — Lincoln Donovan
*Assistant Examiner* — Jung H Kim
(74) *Attorney, Agent, or Firm* — Patterson & Sheridan, LLP

(57) ABSTRACT

A buffer circuit includes a first inverter circuit that inverts an input signal, a second inverter circuit that inverts the output signal of the first inverter circuit, an impedance element connected between the first inverter circuit and the second inverter circuit, a first conductivity type switching element that increases a potential of the output node of the second inverter circuit when the input signal exceeds a first threshold voltage, and a second conductivity type switching element that decreases a potential of the output node of the second inverter circuit when the input signal is lower than a second threshold voltage.

17 Claims, 18 Drawing Sheets

7

7
(A COMPARATIVE EXAMPLE)

(ANOTHER COMPARATIVE EXAMPLE)

CLK FREQUENCY = 25 MHz, COUPLING CAPACITANCE = 0.1 fF

CLK FREQUENCY = 25 MHz, COUPLING CAPACITANCE = 2.4 fF

CLOCK FREQUENCY = 25 MHz

BUFFER CIRCUIT AND SWITCHING CONTROLLER

CROSS-REFERENCE TO RELATED APPLICATION

This application is based upon and claims the benefit of priority from Japanese Patent Application No. 2013-026944, filed Feb. 14, 2013, the entire contents of which are incorporated herein by reference.

FIELD

Embodiments described herein relate to a buffer circuit and a switching controller having the buffer circuit.

BACKGROUND

The high frequency circuit section of a cell phone, smart phone, or other portable terminals includes a transmitting circuit, a receiving circuit, and a high frequency switching circuit. Generally, the transmitting circuit and the receiving circuit are connected to a shared antenna via the high frequency switching circuit. Currently, most portable terminals are made to be multi-mode and multi-band compatible. As a result, the number of ports needed for the high frequency switching circuit has increased to accommodate multi-mode/multi-band operations. As the port number increases, the number of bits of the control signal needed for controlling the connecting state of the high frequency switching circuit also increases.

For an integrated circuit (IC) containing the high frequency switching circuit, in order to decrease the number of terminals needed for the control signals, serial control signals may be input. In this case, to convert the serial control signal to a parallel control signal, a series-parallel converter is arranged inside the IC.

The series-parallel converter carries out the series/parallel conversion for the control signal in synchronization with a clock signal. The frequency of the clock signal can be about 26 MHz, for example. In this case, the rise time and fall time of the clock signal each are about 1 ns and a harmonic of about 1 GHz is generated. Because this harmonic has a frequency close to the frequency of the high frequency signal switched by the high frequency switching circuit, the harmonic will be superposed as noise on the high frequency signal.

DETAILED DESCRIPTION

Embodiments provide a buffer circuit that can suppress a harmonic in the high frequency band generated by a high frequency switching circuit and a switching controller that includes a buffer circuit of this type.

In general, embodiments will be described with reference to the figures.

An embodiment provides a buffer circuit including a first inverter circuit that receives an input signal and outputs an inverted input signal. A second inverter circuit of the buffer circuit receives the inverted input signal and outputs an output signal. An impedance element is connected between an output node of the first inverter circuit and an input node of the second inverter circuit. A switching element of a first conductivity type increases the potential of an output node of the second inverter circuit when the input signal exceeds a first threshold voltage. A switching element of a second conductivity type decreases potential of the output node of the second inverter circuit when the input signal is lower than a second threshold voltage.

First Embodiment

Figure 1:
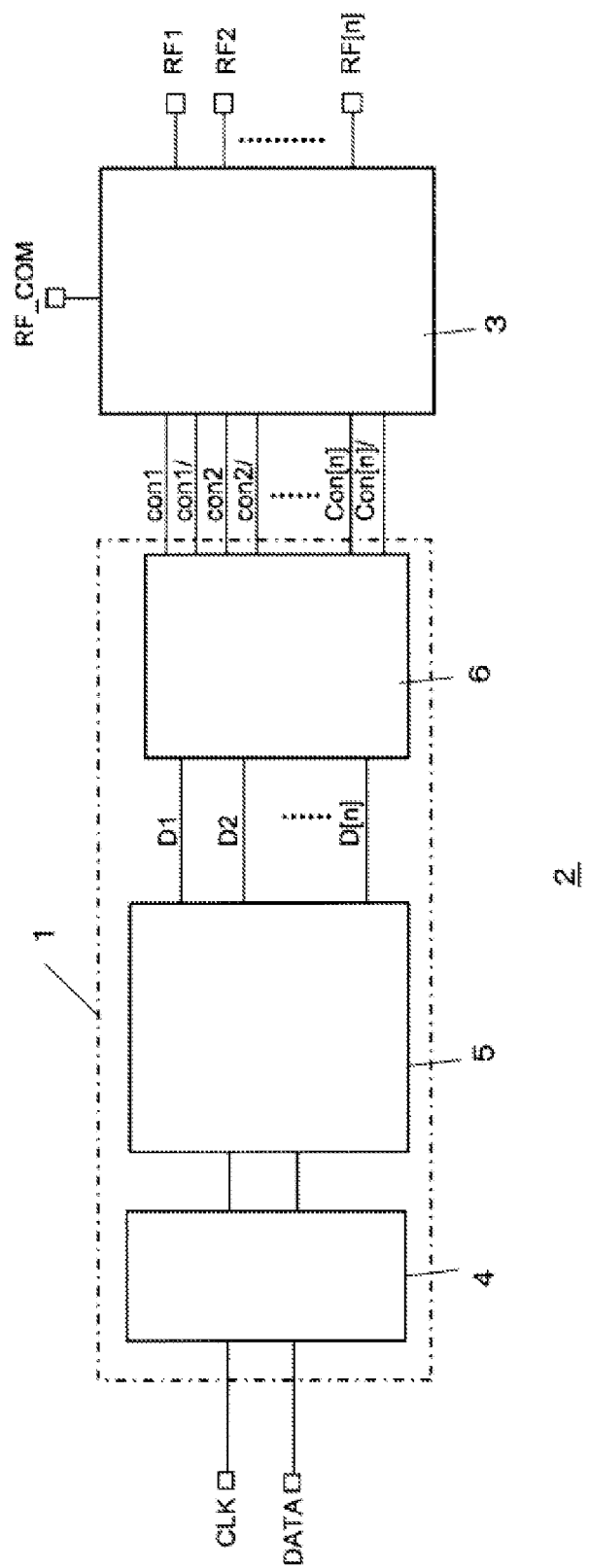
FIG. 1 is a block diagram illustrating the schematic configuration of a semiconductor device including a switching controller according to a first embodiment.

FIG. 1 is a block diagram illustrating the schematic configuration of semiconductor device 2 including a switching controller 1 according to the first embodiment. The semiconductor device 2 shown in FIG. 1 can be formed as a one-chip configuration. However, semiconductor device 2 may also comprise plural chips and some component parts may be discrete parts on the same chip or located on another chip.

According to the present embodiment, the entirety of the semiconductor device 2 shown in FIG. 1 is formed on a single silicon-on-insulator (SOI) substrate. Because the SOI substrate has a high resistance, it is possible to suppress the loss of signal due to leakage of the high frequency signal to the substrate side.

The semiconductor device 2 shown in FIG. 1 can be conceptually divided into a switching controller 1 and a high frequency switching circuit 3. The high frequency switching circuit 3 selects one of the plural RF signal terminals RF1 to RFn and is connected to the antenna terminal RF_COM. The plural RF signal terminals RF1 to RFn are connected to a transceiver (not shown in FIG. 1). The transceiver can generate individual RF signals for each wireless system so that the semiconductor device 2 can cope with plural wireless systems. In conventional wireless equipment, at least one of the semiconductor devices 2 shown in FIG. 1 would be included.

The switching controller 1 includes a buffer circuit 4, a series-parallel converter 5, and a driver circuit 6.

The buffer circuit 4 carries out a waveform shaping treatment for a clock signal CLK input from the semiconductor device 2. The clock signal is input to the series-parallel converter 5 after having its waveform shaped by the buffer circuit 4.

The series-parallel converter 5 converts a serial switching control signal that instructs the switching of the high frequency switching circuit 3 to a parallel switching control signal in synchronization with the clock signal.

On the basis of the parallel switching control signal converted by the series-parallel converter 5, the high frequency switching circuit 3 selects and outputs to one of the plural RF signal terminals RF1 to RFn.

Figure 2:
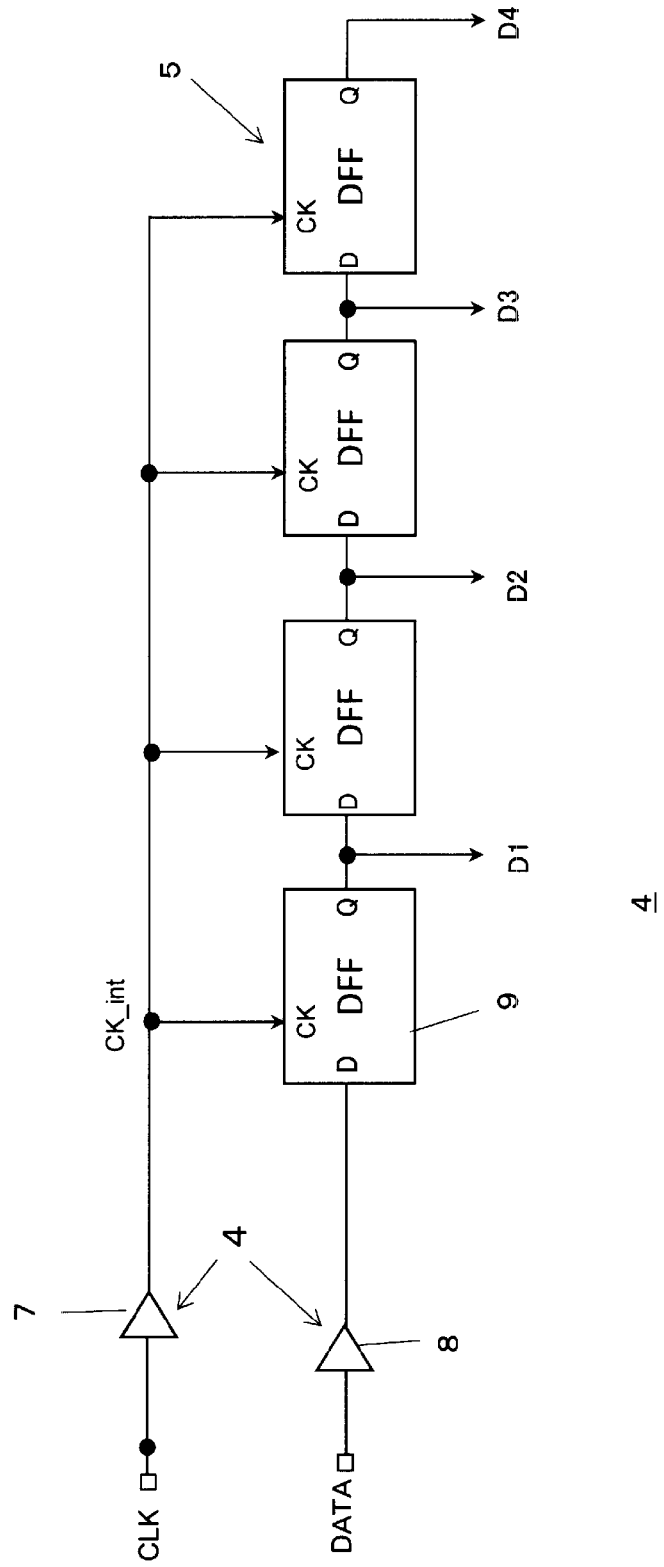
FIG. 2 is a block diagram illustrating an example of the internal configuration of a buffer circuit and a series-parallel converter.

FIG. 2 is a block diagram illustrating an example internal configuration of the buffer circuit 4 and the series-parallel converter 5. As shown in FIG. 2, the buffer circuit 4 includes a clock input buffer 7 and a data input buffer 8. The clock input buffer 7 carries out waveform shaping for the clock signal CLK received at the CLK input terminal. The data input buffer 8 buffers and outputs the serial switching control signal data received at the DATA input terminal.

The series-parallel converter 5 shown in FIG. 2 includes plural D type flip-flops (hereinafter to be referred to as DFF) 9 connected in series. The clock signal CK_int output from the buffer circuit 4 is input to each of the clock terminals CK of the DFF 9. The input terminal D of the initial-step DFF 9 receives the serial switching control signal data output from the data input buffer 8. As a result, the serial switching control signal data are sequentially propagated and output in the DFF 9 in synchronization with the clock signal CLK. From the output terminals Q of the DFF 9, the parallel switching control signals D1, D2, D3 obtained by the series-parallel conversion of the serial switching control signal data are output.

Figure 3:
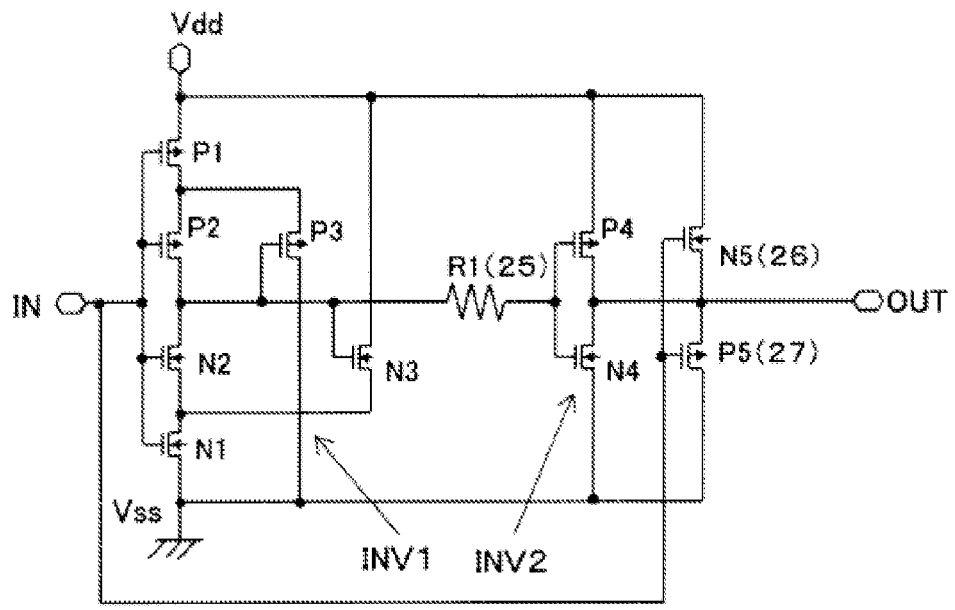
FIG. 3 is a circuit diagram illustrating an example configuration of a clock input buffer in a buffer circuit.

FIG. 3 is a circuit diagram illustrating an example of the configuration of the clock input buffer 7. The clock input buffer 7 shown in FIG. 3 includes a first inverter circuit INV1, a second inverter circuit INV2, an impedance element 25, a first conductivity type switching element 26, and a second conductivity type switching element 27.

The first inverter circuit INV1 is a Schmitt trigger type inverter circuit having hysteresis characteristics, and first inverter circuit INV1 inverts and outputs the input signal IN. The input signal IN is the clock signal CLK.

More specifically, the first inverter circuit INV1 includes PMOS transistors P1 to P3 and NMOS transistors N1 to N3. The PMOS transistors P1, P2 and the NMOS transistors N2, N1 are connected in series between the power supply voltage Vdd and the ground voltage (the second reference voltage) Vss. Gates o of transistors P1, P2, N1, N2 are connected to the input signal IN. The drains of the PMOS transistor P2 and the NMOS transistor N2 are connected to the gates of the PMOS transistor P3 and the NMOS transistor N3, respectively. The source of the PMOS transistor P3 is connected to the drain of the PMOS transistor P1 and the source of the PMOS transistor P2. The drain of the PMOS transistor P3 is set at the ground voltage Vss. The drain of the NMOS transistor N3 is set at the power supply voltage Vdd, and the source of the NMOS transistor N3 is connected to the source of the NMOS transistor N2 and the drain of the NMOS transistor N1.

The second inverter circuit INV2 inverts and outputs the output signal of the first inverter circuit INV1. The second inverter circuit INV2 includes a PMOS transistor (second PMOS transistor) P4 and an NMOS transistor (second NMOS transistor) N4 connected in series between the power supply voltage Vdd and the ground voltage Vss.

The impedance element 25 is made of, for example, a resistor element R1 connected between the output node of the first inverter circuit INV1 and the input node of the second inverter circuit INV2.

For a first conductivity type switching element 26, when the input signal is over a first threshold voltage, the element 26 increases the potential at the output node of the second inverter circuit INV2. As an example of the first conductivity type switching element 26, it is an NMOS transistor (first NMOS transistor) N5 of which drain the power supply voltage Vdd (the first reference voltage) is applied to, with the output node of the second inverter circuit INV2 being connected to its source, and it includes its gate connected to the input node IN.

When the input signal becomes lower than the second threshold voltage, the second conductivity type element 27 decreases the potential of the output node of the second inverter circuit INV2. An example of the second conductivity type element 27 is a PMOS transistor (first PMOS transistor) P5 that has the output node OUT of the second inverter circuit INV2 connected to its source, the drain set at the ground voltage Vss, and the gate connected to the input node IN.

By arranging the impedance element 25 between the output node of the first inverter circuit INV1 and the input node of the second inverter circuit INV2, the waveform of the clock signal CLK output from the first inverter circuit INV1 becomes gentler, and the harmonic component of the clock signal CLK is decreased.

However, as the impedance element 25 also causes the delay time of the clock signal CLK to become longer. Here, according to the present embodiment, the PMOS transistor P5 and the NMOS transistor N5 are arranged on the later section side of the second inverter circuit INV2. Thus, when the potential of the clock signal CLK output from the first inverter circuit INV1 makes a transition from the low level to the high level, the PMOS transistor P5 makes a transition from ON to OFF, while the NMOS transistor N5 makes a transition from OFF to ON. However, during the transition process, the drains of the PMOS transistor P5 and the NMOS transistor N5 reach a high impedance state. The reason is that for both transistors, the gate-source voltage becomes lower than the threshold voltage in this case. Consequently, at the output node of the clock input buffer 7, the potential starts changing before the change in the potential at the input node of the second inverter circuit INV2. However, such a change in the potential takes place until halfway point is reached and the potential then varies in synchronization with the inverted output timing. As a result, for the clock input buffer 7, although there is no significant change in the hysteresis characteristics of the first inverter circuit INV1, a Schmitt trigger type inverter circuit, it is still possible to shorten the delay time generated by the impedance element 25.

Figure 4:
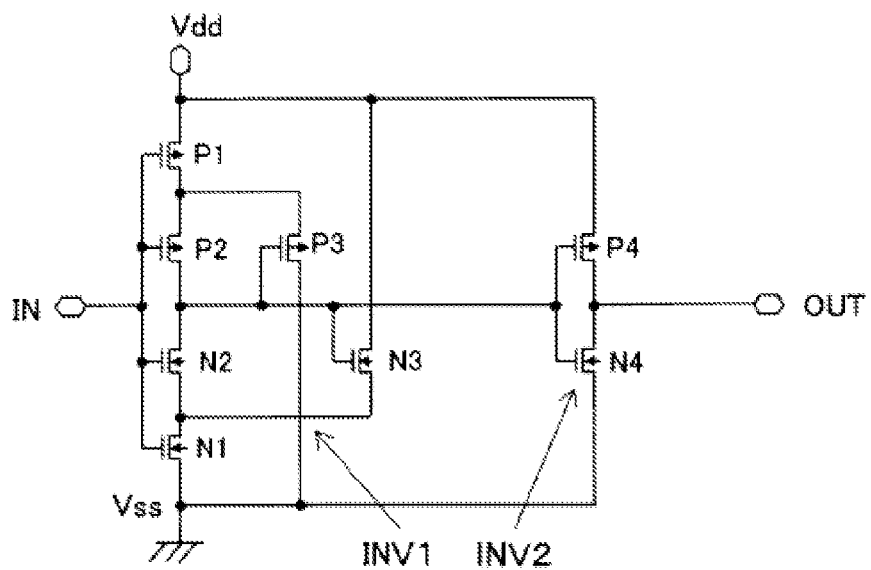
FIG. 4 is a circuit diagram illustrating the configuration of an input buffer according to a comparative example.

FIG. 4 is a circuit diagram illustrating the detailed configuration of the clock input buffer 7 according to a comparative example. The comparative example clock input buffer 7 shown in FIG. 4 is lacking impedance element 25, the first PMOSFET, and the PMOS transistor P5 from the circuit configuration shown in FIG. 3.

Figure 5:
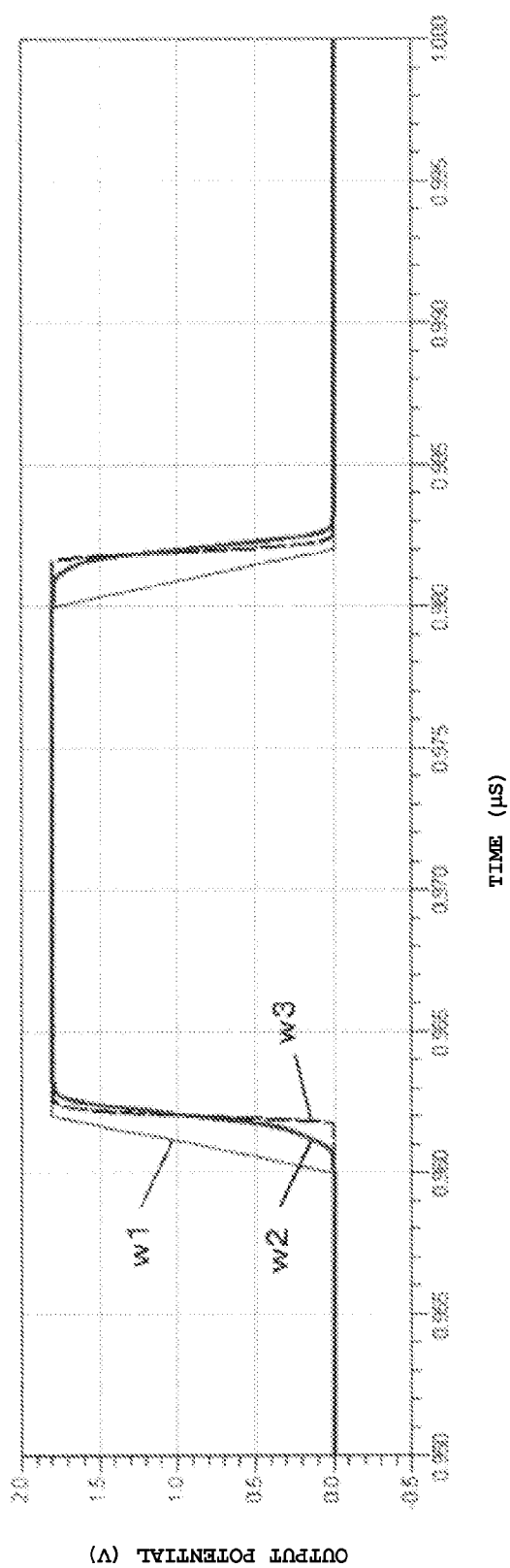
FIG. 5 is a graph showing the input/output characteristics of the clock input buffer shown in FIGS. 3 and 4.

FIG. 5 is a graph showing the input/output characteristics of the clock input buffers 7 shown in FIG. 3 and FIG. 4. FIG. 5 shows the waveform w1 of the clock signal CLK (input clock signal CLK) input to each clock input buffer 7, the waveform w2 of the clock signal CLK (output clock signal CLK) output from the clock input buffer 7 shown in FIG. 3, and the waveform w3 of the clock signal CLK (output clock signal CLK) output from the clock input buffer 7 shown in FIG. 4.

As can be seen from FIG. 5, the delay times of the waveform w2 and waveform w3 with respect to the waveform w1 are almost identical to each other. However, the slope of waveform w2 at the rising edge and the falling edge is gentler (less steep) than that of waveform w3.

Figure 6A:
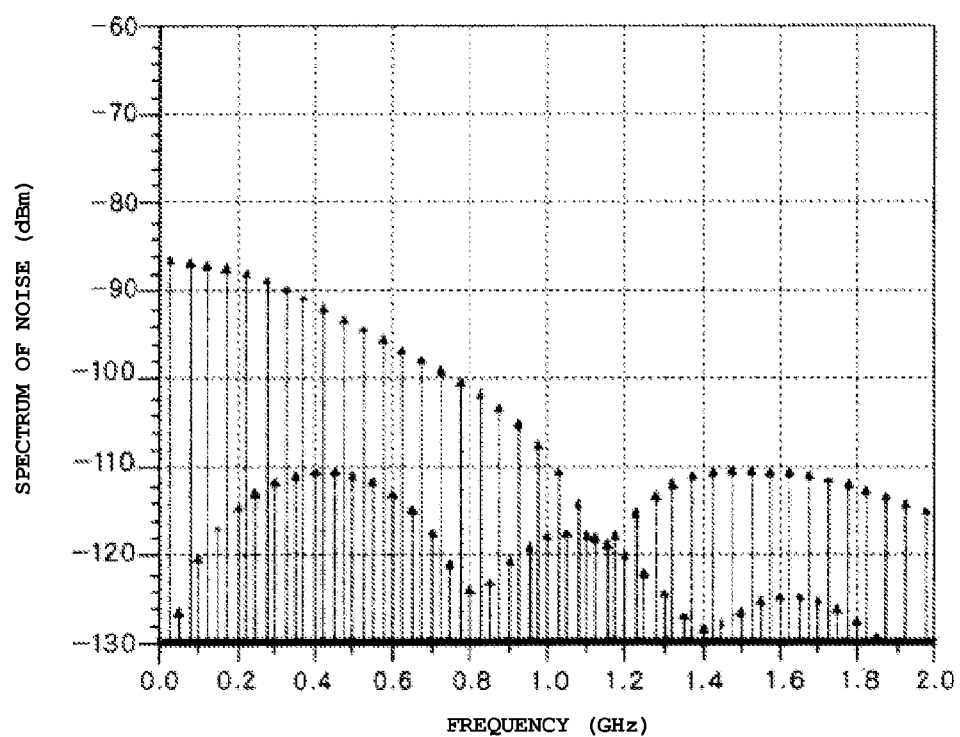
FIG. 6A is a frequency spectrum diagram depicting an output clock signal CLK of the clock input buffer shown in FIG. 3.
Figure 6B:
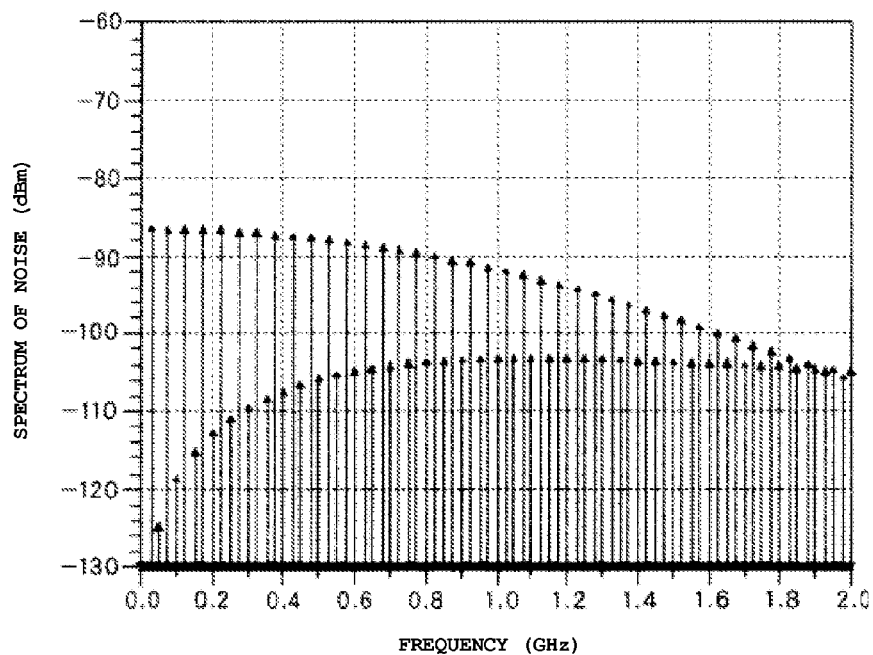
FIG. 6B is a frequency spectrum diagram depicting an output clock signal CLK of the clock input buffer shown in FIG. 4.

FIG. 6 includes frequency spectrum diagrams corresponding to the graph shown in FIG. 5. FIG. 6A is a frequency spectrum diagram of the output clock signal CLK of the clock input buffer 7 shown in FIG. 3. FIG. 6B is a frequency spectrum diagram of the output clock signal CLK of the clock input buffer 7 shown in FIG. 4.

As can be seen by comparing FIG. 6A with FIG. 6B, in the case shown in FIG. 6A, it is possible to suppress the harmonic component near 1 GHz as the frequency band of the high frequency signal switched and controlled by the high frequency switching circuit 3, on the other hand, in the case shown in FIG. 6B, the harmonic component near 1 GHz is significant. This result indicates that when the clock input buffer 7 shown in FIG. 3 is used, there is significantly less adverse influence on the high frequency switching circuit 3 that switches and controls the high frequency signal of the 1 GHz band.

FIG. 5, FIG. 6A, and FIG. 6B illustrate the results of a simulation where it is assumed that MOS transistors formed on an SOI substrate are used to form the clock input buffer 7. Here, for these simulated MOS transistors, the gate length is 0.25 µm and the gate oxide film thickness is 9 nm, while the values of the gate width Wg of the NMOS transistor N4 and PMOS transistor P4 that form the second inverter circuit INV2 in the clock input buffer 7, as well as the NMOS transistor N5 and PMOS transistor P5, are set as follows:

Wg of the NMOS transistor=16 µm, Wg of the PMOS transistor=32 µm

Wg of the NMOS transistor N5=32 µm, Wg of the PMOS transistor=32 µm

Also, the simulated impedance element 25 has a resistance of 10 kΩ, and the output capacitance of the output node of the clock input buffer 7 is 1 pF.

In the following, the circuit constant of the clock input buffer 7 will be explained in detail. As explained above, by arranging the impedance element 25, the input waveform for the second inverter circuit INV2 including the NMOS transistor N4 and the PMOS transistor P4 becomes gentler, and it is possible to decrease the harmonic noise of a component with the same frequency as that of the high frequency signal that is being switched and controlled by the high frequency switching circuit 3.

However, as the impedance of the impedance element 25 is increased, the delay time in the output signal with respect to the input signal to the clock input buffer 7 is increased.

Figure 7:
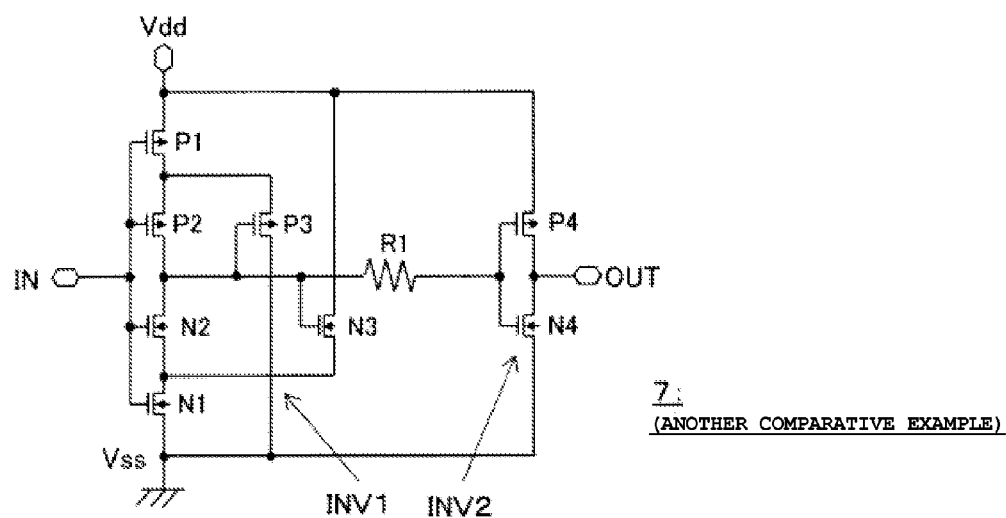
FIG. 7 is a circuit diagram illustrating a clock input buffer according to another comparative example.
Figure 8:
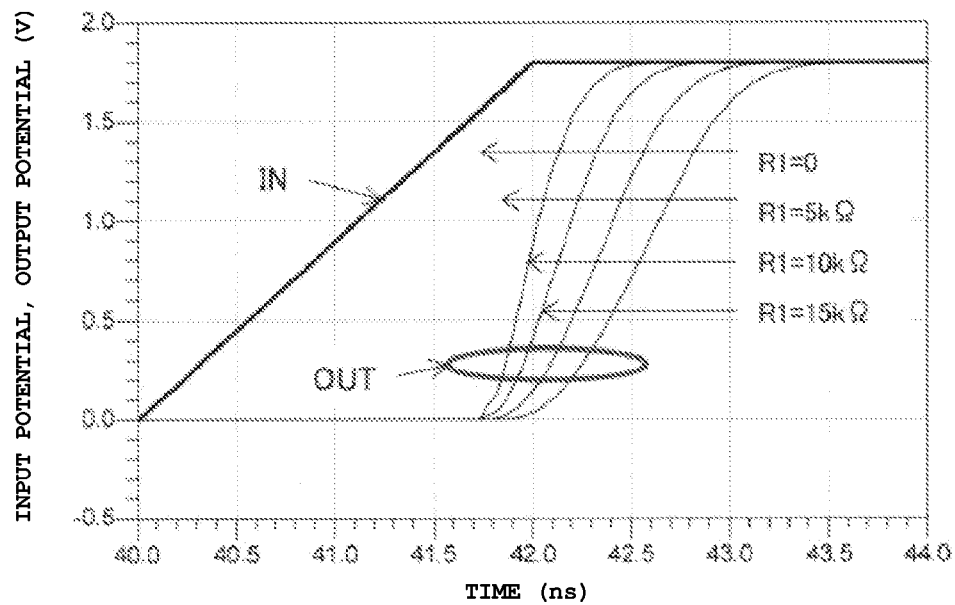
FIG. 8 is a graph showing the results from a simulation of a delay time of the output signal versus an input signal of the clock input buffer shown in FIG. 7.

FIG. 7 is a circuit diagram illustrating the clock input buffer 7 according to another comparative example. FIG. 8 is a graph showing the results of a simulation of the delay time of the output signal with respect to the input signal of the clock input buffer 7 shown in FIG. 7. FIG. 8 shows the waveform of the input signal IN and the waveform of the output node OUT when the impedance element 25 has different resistance values.

As shown in FIG. 8, when the resistance of the impedance element 25 is increased, the delay time of the output node OUT increases.

Figure 9A:
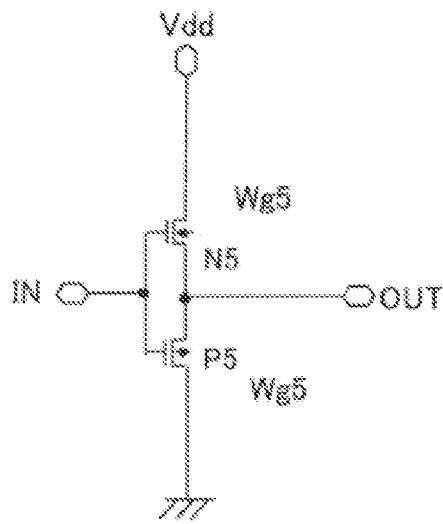
FIG. 9A is a circuit diagram illustrating a circuit to be connected to the clock input buffer shown in FIG. 3.
Figure 9B:
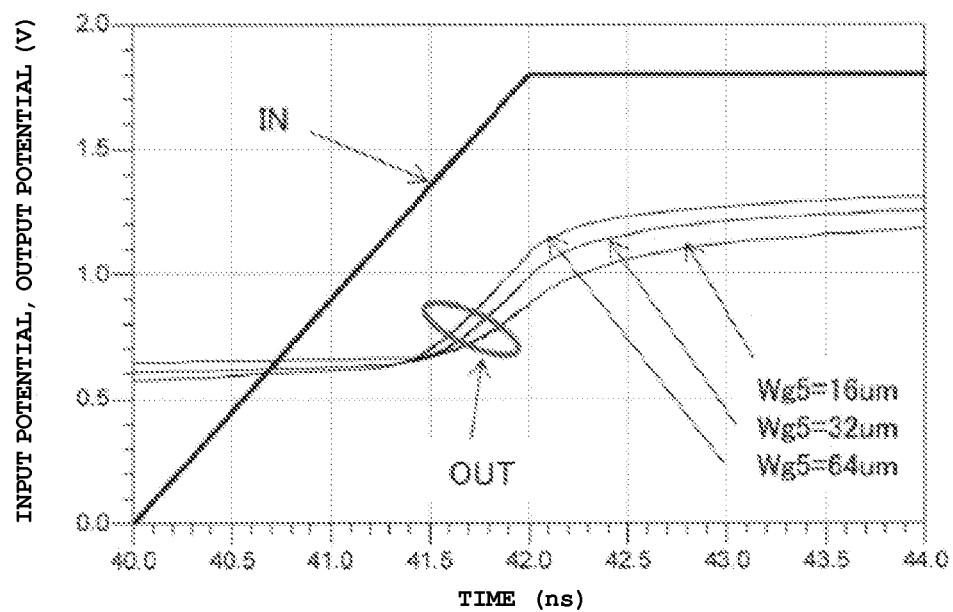
FIG. 9B is a diagram depicting results of a simulation of the circuit shown in FIG. 9A.

On the other hand, FIG. 9A is a circuit diagram in which only the NMOS transistor N5 and the PMOS transistor P5 connected to the last section of the clock input buffer 7 shown in FIG. 3 are shown. FIG. 9B is a diagram illustrating simulation results for the circuit shown in FIG. 9A. FIG. 9B shows the waveform of the input signal IN and the waveform of the output node OUT when the NMOS transistor N5 and the PMOS transistor P5 have different gate widths Wg5.

As can be seen from FIG. 9B, the larger the gate widths Wg5 of the NMOS transistor N5 and the PMOS transistor P5, the steeper the rising edge of the output node OUT.

As the input signal is input to the gates of the NMOS transistor N5 and the PMOS transistor P5, respectively, as the potential of the input signal changes, the potential at the output node OUT changes quickly for the NMOS transistor N5 and the PMOS transistor P5. In this case, it can be seen from the results of the simulation shown in FIG. 9B that when the gate width is larger for the NMOS transistor N5 and the PMOS transistor P5, the potential at the output node OUT can change more quickly.

Consequently, the gate widths Wg5 of the NMOS transistor N5 and the PMOS transistor P5 are preferably close to or larger than the gate widths of the NMOS transistor N4 and the PMOS transistor P5.

One may also adopt a scheme in which the gate length is adjusted instead of the gate width. Consequently, it is preferred that to adjust the gate width and/or the gate length to meet the following relationship for the MOS transistors N4, P4, N5, P5 in the clock input buffer 7.

$$\mathrm{MIN}[Wg(N4)/Lg(N4), Wg(P4)/Lg(P4)] \leq \mathrm{MIN}[Wg(N5)/Lg(N5), Wg(P5)/Lg(P5)] \qquad (1)$$

Here, Wg(N4) represents the gate width of the NMOS transistor N4, Lg (N4) represents the gate length of the NMOS transistor N4, Wg (N5) represents the gate width of the NMOS transistor N5, and Lg (N5) represents the gate length of the NMOS transistor N5. Similarly, Wg(P4) represents the gate width of the PMOS transistor P4, Lg (P4) represents the gate length of the PMOS transistor P4, Wg (P5) represents the gate width of the PMOS transistor P5, and Lg (P5) represents the gate length of the PMOS transistor P5.

The above-listed formula (I) indicates that the value obtained by dividing the channel width of the PMOS transistor P5 by its channel length or the value obtained by dividing the channel width of the NMOS transistor N5 by its channel length, whichever is smaller, is equal to or larger than the value obtained by dividing the channel width of the PMOS transistor P4 by its channel length or the value obtained by dividing the channel width of the NMOS transistor N4 by its channel length, whichever is smaller.

In this way, when the clock signal CLK is generated by the clock input buffer 7, the clock signal CLK is not significantly delayed, and the waveforms of the rising edge and the falling edge of the clock signal CLK are gentler. Consequently, the harmonic at a frequency close to the high frequency signal switched and controlled by the high frequency switching circuit 3 generated from the clock signal CLK is suppressed, and the high frequency switching circuit 3 is barely influenced by the harmonic noise.

In the above, an example of the configuration of the circuit of the clock input buffer 7 shown in FIG. 3 is explained. However, it may be preferable that the data input buffer 8 shown in FIG. 2 also be formed using the circuit shown in FIG. 3 to limit harmonic noise generated from the data input to the series-parallel converter 5 as well.

Second Embodiment

In the second embodiment to be explained below, the harmonic noise can be further suppressed as compared with the first embodiment.

Figure 10:
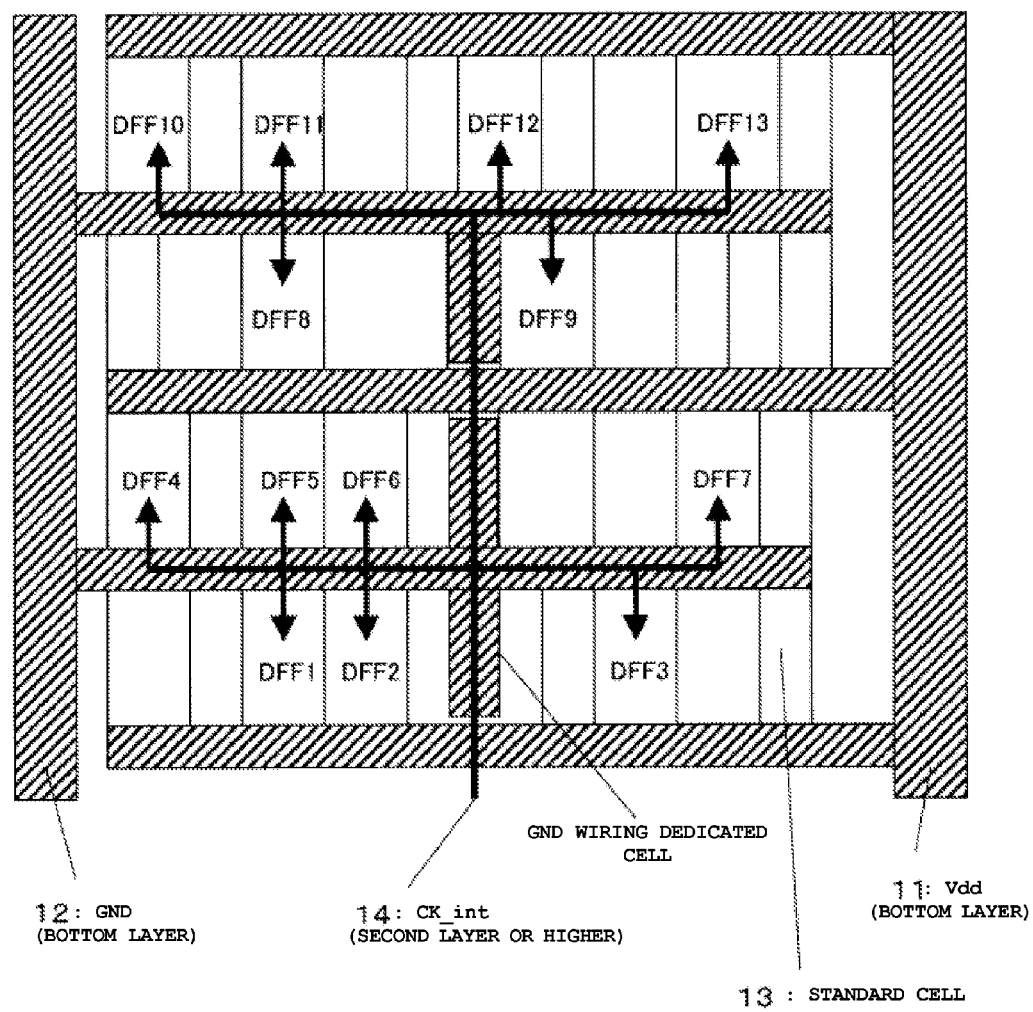
FIG. 10 is a layout diagram illustrating the series-parallel converter in a semiconductor device according to a second embodiment.

The semiconductor device 2 according to a second embodiment has the same schematic configuration as that shown in FIG. 1. FIG. 10 is a diagram illustrating a layout of series-parallel converter 5 in the semiconductor device 2 according to the second embodiment. For example, the semiconductor device 2 may be formed in plural layers on an SOI substrate.

In a bottom layer (the second pattern layer), plural power supply voltage (Vdd) pattern portions 11 are formed in a comb shape, and plural ground (GND) pattern portions 12 are formed in a comb shape in the gaps formed by pattern portions 11.

For example, the series-parallel converter 5 can be formed using standard cells 13. Here, the standard cells 13 are usually formed in the bottom layer. FIG. 10 shows the cell arrangement regions of the DFF 1 to DFF 13 that form the series-parallel converter 5. The regions of the DFF 1 to DFF 13 are depicted as respective rectangular blocks.

The clock signal CK fed to each DFF is routed in a prescribed layer (the first pattern layer) of the second layer or higher layer. According to the present embodiment, the ground pattern portions 12 are arranged in the first layer (e.g., below the prescribed layer in the second pattern layer) along the pattern 14 of the clock signal CK. As a result, the harmonic noise generated from the clock signal CK does not significantly propagate to the substrate side, and no harmonic noise is superposed on the high frequency switching circuit 3 formed on the same substrate. That is, according to the present embodiment, because no other circuit block is arranged below the pattern 14, it is possible to avoid the capacitive coupling of the pattern 14 carrying the clock signal CK with the other circuit blocks, and the harmonic noise generated from the clock signal CK is not superposed on the other signals.

Figure 11:
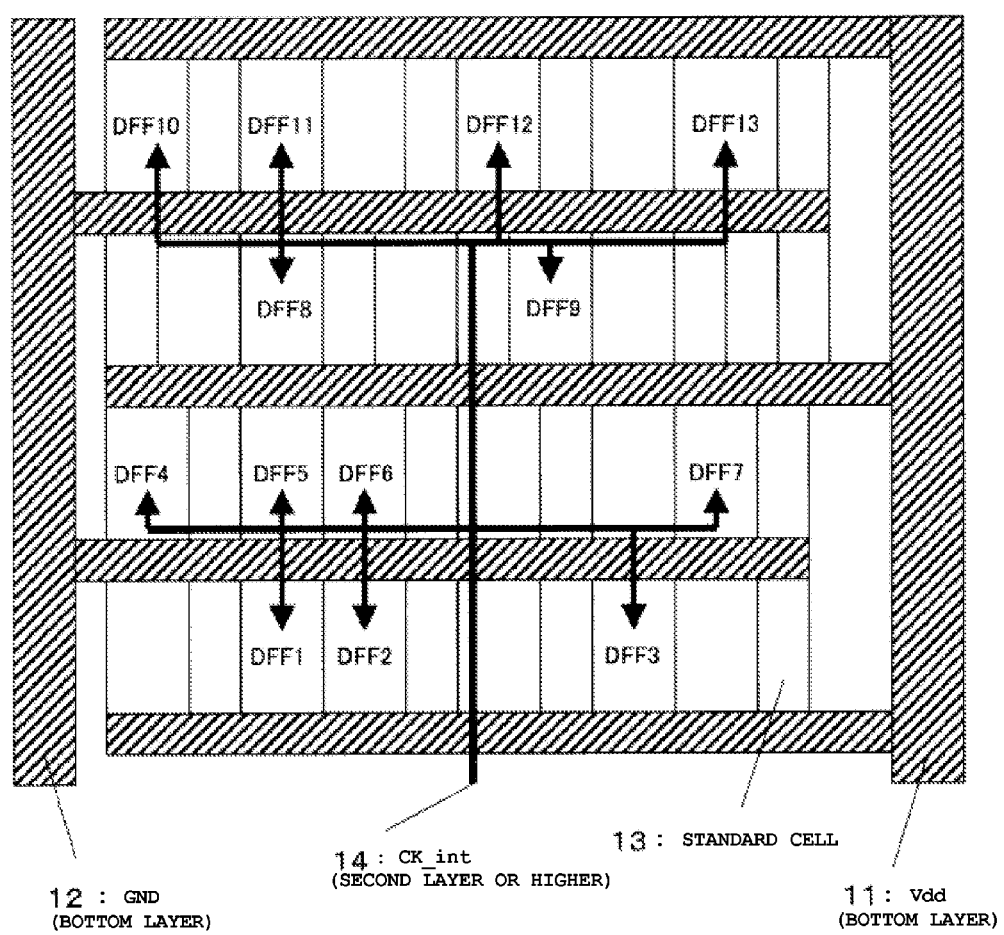
FIG. 11 is a diagram illustrating a layout pattern generated by an automatic setting wiring tool.

FIG. 11 is a diagram illustrating a comparative example of the layout pattern generated by the automatic arranging wiring tool without pattern 14 arranged along the ground pattern portions 12. In the case of FIG. 11, the position of the pattern 14 of the clock signal CK and the position of the ground pattern portions 12 are offset from each other.

A simulation of the harmonic noise for the layout diagram shown in FIG. 10 and the harmonic noise for the layout diagram shown in FIG. 11 was made.

Figure 12:
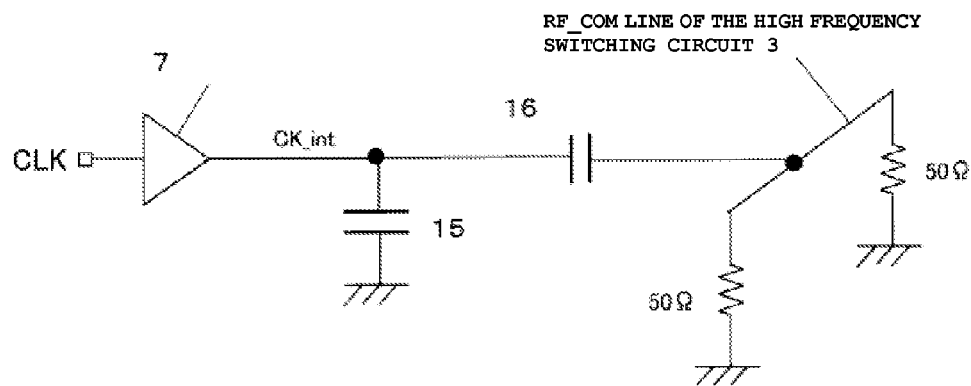
FIG. 12 is a circuit diagram adopted for simulation purposes.

FIG. 12 is the circuit diagram used in generating the simulation results. The circuit shown in FIG. 12 is a clock input buffer 7 in the configuration of the Schmitt trigger circuit, and the load capacitance 15 is connected to its output. Because the RF_COM line of the high frequency switching circuit 3 shown in FIG. 1 is of a 50Ω system, the circuit shown in FIG. 12 is modeled by the wiring having the two ends terminated by 50Ω. The coupling capacitance 16 is connected between the clock signal CK and the RF_COM line. The frequency of the clock signal CK output from the clock input buffer 7 is set at 25 MHz.

In order to determine the value of the coupling capacitance 16, an analysis of the electromagnetic field for both the layout diagram of the present embodiment shown in FIG. 10 and the layout diagram of the comparative example shown in FIG. 11 was carried out. As a result, for the layout diagram shown in FIG. 11, the coupling capacitance=2.4 fF, and, for the layout diagram shown in FIG. 10, the coupling capacitance=0.1 fF.

Figure 13:
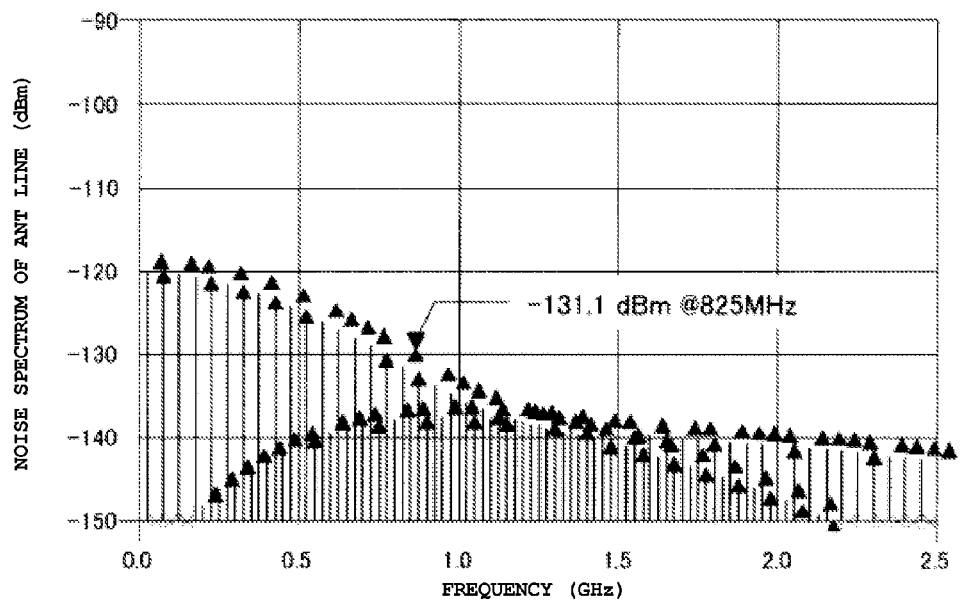
FIG. 13 is a graph showing the results of a simulation of a device according to the layout diagram shown in FIG. 10.
Figure 14:
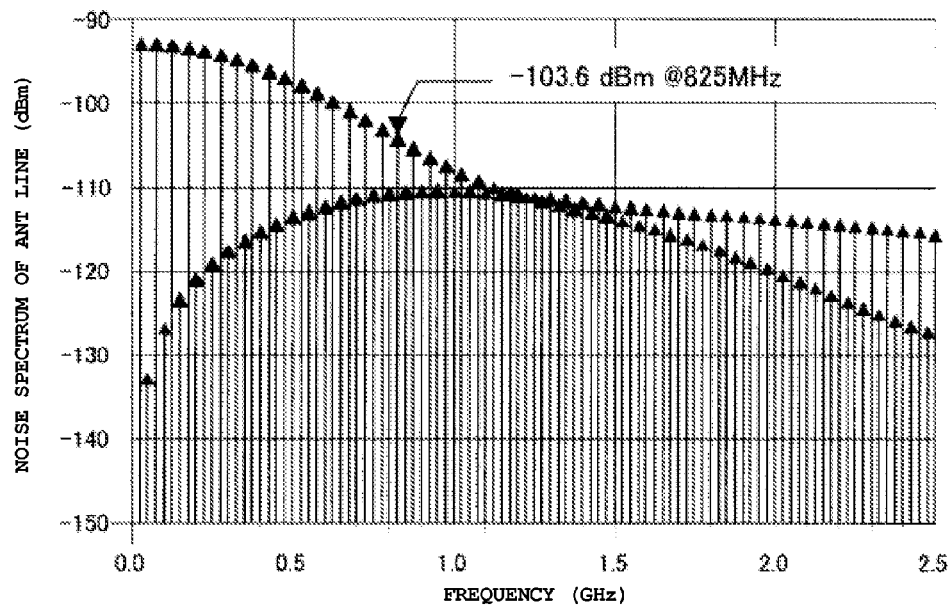
FIG. 14 is a graph showing the results of simulation of a comparative example shown in FIG. 11.

FIG. 13 is a graph showing the simulation results for the layout diagram in the present embodiment shown in FIG. 10. FIG. 14 is a graph showing the simulation results in a comparative example shown in FIG. 11.

As far as the noise level at frequency of 825 MHz is concerned, it is −103.6 dBm for the comparative example shown in FIG. 14 and it is −131.1 dBm in the present embodiment shown in FIG. 13. Consequently, the noise level is improved by 27.5 dB.

For cell phones, it is generally required that the noise level in the high frequency switching circuit 3 be −130 dBm or lower. As can be seen from FIG. 13, this requirement can be met by this embodiment.

Figure 15:
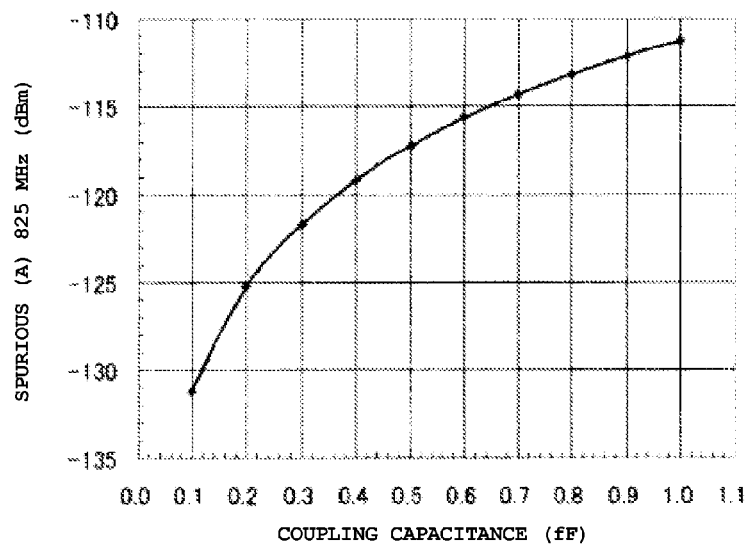
FIG. 15 is a graph showing the dependence of noise power on the coupling capacitance.

FIG. 15 is a graph showing the dependence of the noise power on the coupling capacitance. Here, the abscissa represents the coupling capacitance (fF) and the ordinate represents the spurious signal (MHz). According to FIG. 15, to suppress the noise level to −130 dBm or lower, a coupling capacitance of 0.12 fF or smaller is required.

In this way, as the ground pattern portions 12 are formed along the pattern 14 in a layer below the pattern 14 such that it is possible to suppress the capacitive coupling of the harmonic noise generated in series-parallel converter 5 with another circuit block via the semiconductor substrate. In particular, according to the present embodiment, it is possible to prevent the capacitive coupling of the harmonic noise of the clock signal CK of the series-parallel converter 5 to the high frequency switching circuit 3, so that it is possible to decrease the harmonic noise in the high frequency switching circuit 3.

Figure 16:
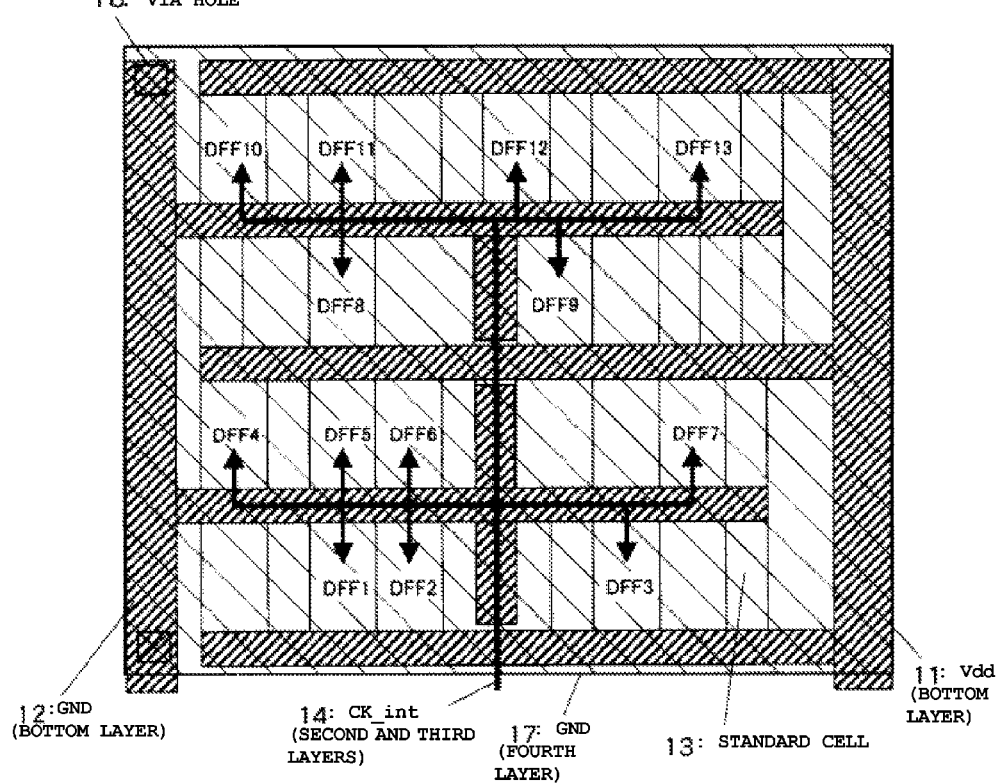
FIG. 16 is a layout diagram illustrating a modified example of the series-parallel converter according to the second embodiment.

FIG. 16 shows a modified example of the layout diagram of the series-parallel converter 5 shown in FIG. 10. For the layout diagram shown in FIG. 16, the first to third layers are the same as those shown in FIG. 10, and a fourth layer made of a solid ground layer 17 is added. FIG. 16 shows the fourth layer made of the solid ground layer 17 as a diagonal hatching. The solid ground layer 17 is arranged so that it covers the entirety of the layout block of the series-parallel converter 5, and it is connected to the ground pattern portions 12 on the first layer through via holes 18.

As shown in FIG. 16, by arranging the solid ground layer 17, it is possible to further decrease the capacitive coupling on the upper surface side of the layout substrate, so that it is possible to further decrease noise.

Figure 17:
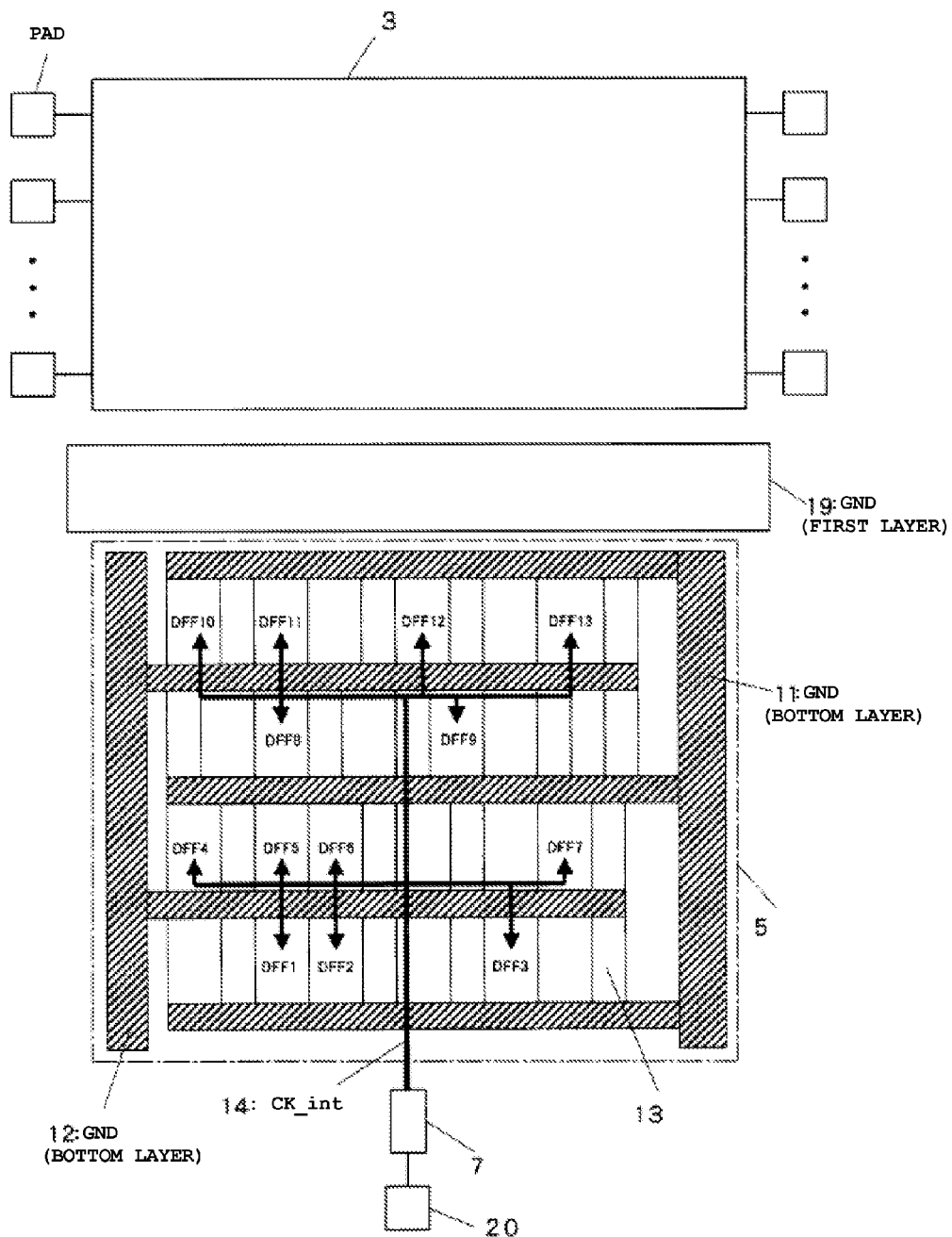
FIG. 17 is a layout diagram illustrating an example of the layout configuration of the semiconductor device according to the first embodiment incorporating the series-parallel converter according to the second embodiment.

FIG. 17 is a layout diagram illustrating an example of the layout configuration of the semiconductor device 2 with the same configuration as that shown in FIG. 1 having the series-parallel converter 5 according to the present embodiment. According to the layout diagram shown in FIG. 17, the ground layer 19 formed in the first layer is arranged between the series-parallel converter 5 and the high frequency switching circuit 3. In the example shown in FIG. 17, the configuration of the layout of the series-parallel converter 5 is the same as that shown in FIG. 10. However, one may also adopt a scheme in which it is the same as that shown in FIG. 16.

As shown in FIG. 17, the clock input buffer 7 that feeds the clock signal CK to the series-parallel converter 5 and the CLK pad 20 that receives the clock signal CLK from the outer side are arranged on the side opposite to the ground layer 19, with the series-parallel converter 5 sandwiched between them.

As a result, it is possible to significantly decrease the harmonic noise in the high frequency switching circuit 3 caused by the capacitive coupling of the harmonics generated in the clock signal CK input from the CLK pad 20, the clock signal CK output from the clock input buffer 7, and the clock signal CK propagating in the series-parallel converter 5.

According to the second embodiment, the circuit configuration of the clock input buffer 7 is taken to be the same as that in the first embodiment in the explanation. However, one may also adopt a scheme in which the circuit configuration of the clock input buffer 7 is that shown in FIG. 4 or FIG. 7, although the danger of the generation of harmonic noise may be increased in such a case.

Third Embodiment

According to a third embodiment, the clock signal CK input to the series-parallel converter 5 is assumed to be a differential signal.

Figure 18:
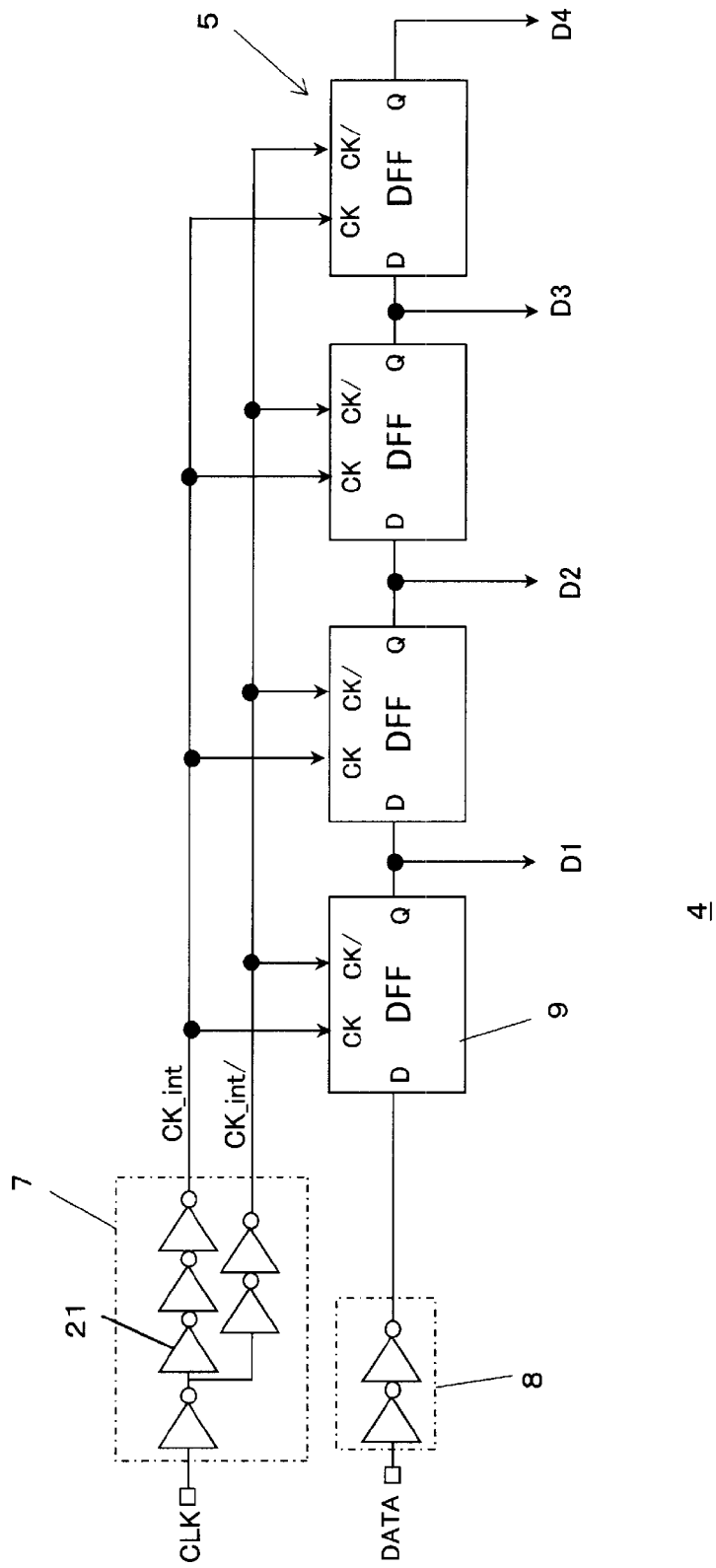
FIG. 18 is a circuit diagram illustrating a buffer circuit and a series-parallel converter in a semiconductor device according to a third embodiment.

The semiconductor device 2 according to the third embodiment has the same block configuration as that shown in FIG. 1. FIG. 18 is a circuit diagram of the buffer circuit 4 and the series-parallel converter 5 according to the third embodiment. The plural register circuits 9 connected in series in the series-parallel converter 5 shown in FIG. 18 respectively include differential clock input terminals CK, CK/. The clock input buffer 7 includes plural inverter circuits 21 that output the clock signal CK input from the outer side in differential form.

As shown in FIG. 18, the differential clock signals CK_int, CK_int/output from the clock input buffer 7 are output via plural inverter circuits 21, so that a delay takes place. Here, in order to adjust the delay time, the data input buffer 8 also includes plural inverter circuits 21 connected in series.

It is preferred that the differential clock signals CK_int, CK_int/ output from the clock input buffer 7 have the phases accurately offset by 180°. Here, by making appropriate adjustment of the circuit constants of the MOS transistors (not shown) in the inverter circuits 21, it is possible to accurately set the phases of the differential clock signals CK_int, CK_int/ offset by 180°.

Also, it is preferred that the signal pattern of the differential clock signals CK_int, CK_int/ be formed by using metal portions on the same layer which are as close as possible on the substrate and with the same width so that the harmonic noises superposed on the differential clock signals CK_int, CK_int/ output from the clock input buffer 7 cancel each other, so that harmonic noise is not superposed on the high frequency switching circuit 3.

The third embodiment may be executed in combination with the second embodiment. That is, the ground layer may be arranged along the signal pattern of the differential clock signals CK_int, CK_int/ in another layer different from the layer in which the signal pattern of the differential clock signals is arranged. In addition, one may also adopt a scheme in which a solid ground layer is arranged in yet another layer so that it covers the entirety of the layout block of the series-parallel converter 5. In addition, one may also adopt a scheme in which, as shown in FIG. 17, a ground layer is arranged between the series-parallel converter 5 and the high frequency switching circuit 3.

The third embodiment may also be executed in combination with the first embodiment. That is, the inverter circuits 21 connected in series in the clock input buffer 7 may have the configuration shown in FIG. 3.

Fourth Embodiment

Figure 19:
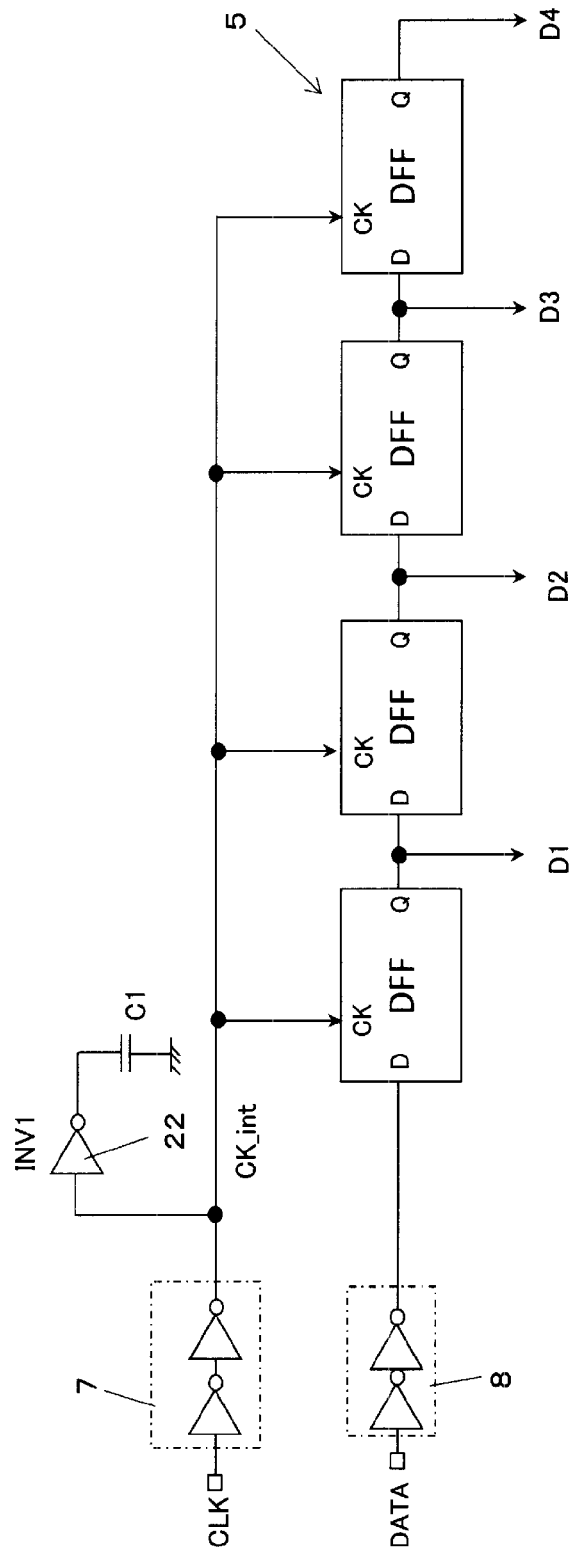
FIG. 19 is a circuit diagram illustrating a buffer circuit and a series-parallel converter in a semiconductor device according to a fourth embodiment.

A fourth embodiment has the same block configuration as that shown in FIG. 1. FIG. 19 is a circuit diagram illustrating buffer circuit 4 and series-parallel converter 5 according to the fourth embodiment. A dummy inverter circuit (a third inverter circuit) 22 is connected to the output node of the clock input buffer 7 shown in FIG. 19. A capacitor C1 is arranged between the output node of the dummy inverter circuit 22 and the ground node (reference voltage node). By adjusting the capacitance value of the capacitor C1 and the location of capacitor C1, it is possible to suppress the harmonic noise generated from clock signal CK fed to the series-parallel converter 5.

The harmonic noise is suppressed as follows: The clock signal CK output from the clock input buffer 7 and the clock signal CK output from the dummy inverter circuit 22 have a phase difference of 180° from each other, so that they may, ideally, each cancel the harmonic noises of the other.

In this way, according to the fourth embodiment, the dummy inverter circuit 22 and the capacitor C1 are connected in series with the output node of the clock input buffer 7, and the capacitance value of the ground capacitor and the site for arranging the capacitor C1 can be adjusted. As a result, it is possible to suppress the harmonic noise generated from the clock signal CK fed to the series-parallel converter 5, and it is possible to decrease the harmonic noise superposed on the high frequency switching circuit 3.

Fifth Embodiment

For the semiconductor device shown in FIG. 1, the ground terminal for the series-parallel converter 5 and the ground terminal for the other circuits are usually separated from each other. The reason is as follows: For example, suppose a high frequency signal is applied on the high frequency switching circuit 3, or suppose the series-parallel converter 5 works in synchronization with the clock signal CK, the ground potential may undergo significant variation and, under its influence, the ground potential level of the other circuit blocks also varies, so that mis-operation may take place.

However, when the ground for the series-parallel converter 5 and the ground for the other circuits are separated from each other, the potential level of one ground terminal may still vary for one or the other, for example, when the series-parallel converter 5 carries out the series-parallel conversion operation in synchronization with the clock signal CK, the ground potential level for the series-parallel converter 5 varies. However, in this case, suppose the ground potential level for the other circuit blocks is constant, in the later-section circuit that receives the parallel switching control signal output from the series-parallel converter 5, this case may be recognized as a variation in the potential level of the parallel switching control signal, and mis-operation may take place.

In a fifth embodiment a measure is taken to ensure that such a type of mis-operation does not take place.

Figure 20:
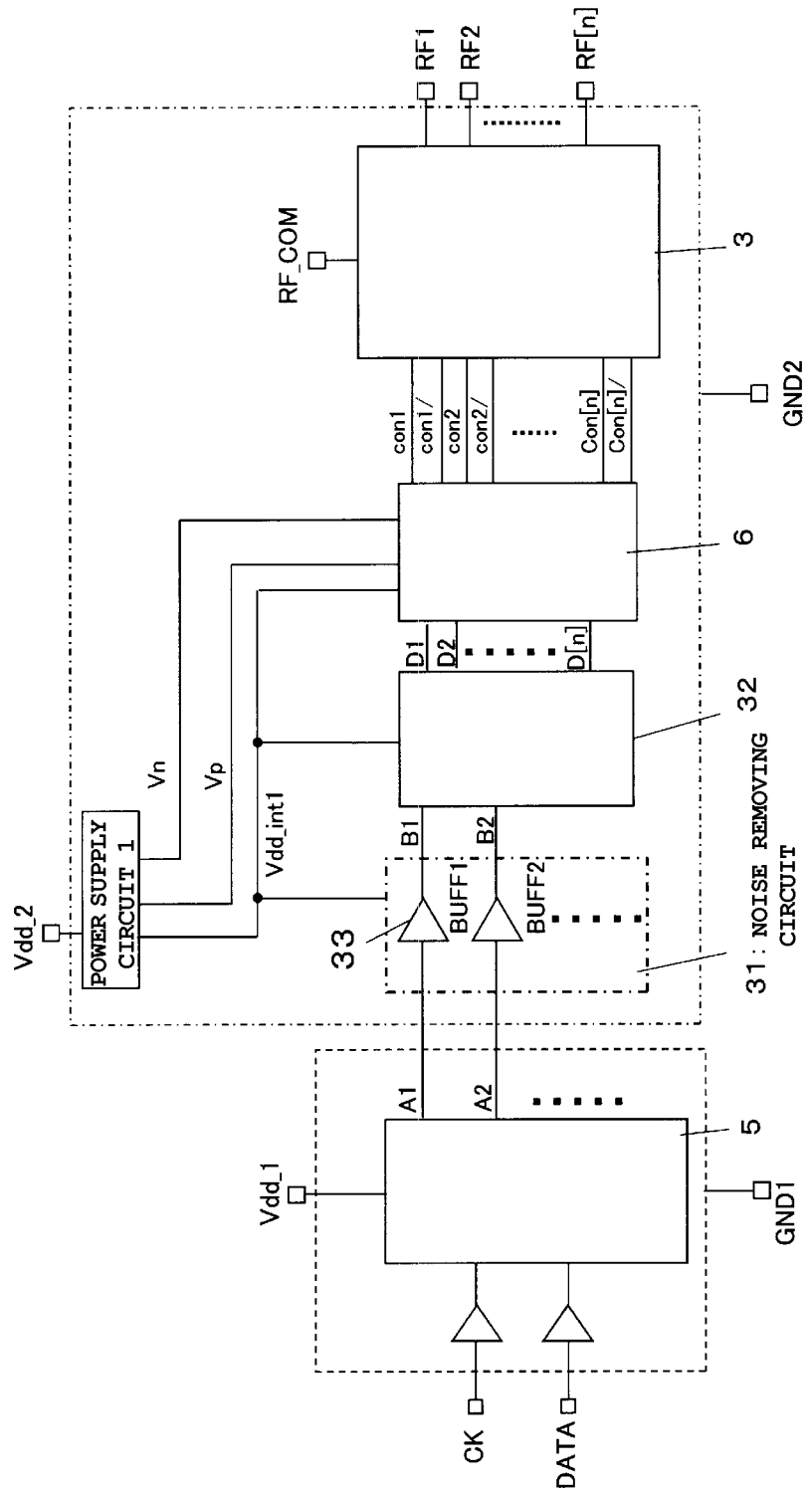
FIG. 20 is a block diagram illustrating the schematic configuration of a semiconductor device according to a fifth embodiment.

FIG. 20 is a block diagram illustrating the schematic configuration of the semiconductor device 2 in the fifth embodiment. In FIG. 20, the same keys as those in FIG. 1 are adopted to represent the common elements. In the following, only the different features will be explained in detail. The semiconductor device 2 shown in FIG. 20 includes a noise removing circuit 31 and a decoder circuit 32 between the series-parallel converter 5 and the driver circuit 6. However, the decoder circuit 32 is not a necessity. The ground for the series-parallel converter 5 and the ground for the other circuit blocks are arranged as indicated with GND1 connected to the series-parallel converter 5 and GND2 connected to the other circuit blocks.

The noise removing circuit 31 includes plural Schmitt trigger buffer sections 33 connected to the parallel switching control signals output from the series-parallel converter 5, respectively.

Figure 21:
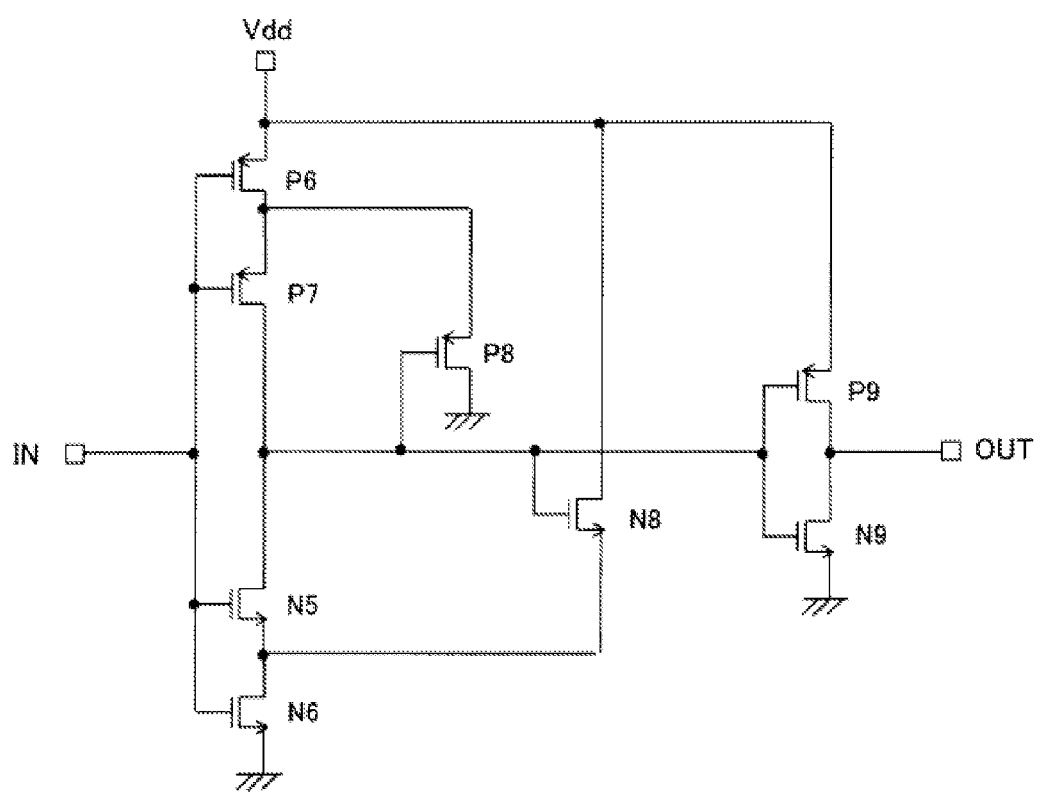
FIG. 21 is a circuit diagram illustrating an example of the internal configuration of the Schmitt trigger buffer section.

FIG. 21 is a circuit diagram illustrating an example of the internal configuration of the Schmitt trigger buffer section 33. The Schmitt trigger buffer section 33 shown in FIG. 21 includes PMOS transistors P6 to P9 and NMOS transistors N5 to N9.

The PMOS transistors P6, P7, the NMOS transistors N5, N7, and the PMOS transistors are connected in series between the power supply voltage Vdd and the ground voltage Vss, and the gates of the transistors are connected to the input node IN.

The gate of the PMOS transistor P8 is connected to the two drains of the PMOS transistor P7 and the NMOS transistor N5. The source of the PMOS transistor P8 is connected to the drain of the PMOS transistor P6 and the source of the PMOS transistor P7, and the drain of the PMOS transistor P8 is connected to the ground.

The gate of the NMOS transistor N8 is connected to the two drains of the PMOS transistor P7 and the NMOS transistor N5. The drain of the NMOS transistor is set at the power supply voltage Vdd, and the source of the NMOS transistor is connected to the source of the NMOS transistor N5 and the drain of the NMOS transistor N7.

The PMOS transistor P9 and the NMOS transistor N9 are connected in series between the power supply voltage Vdd and the ground voltage Vss. The drains of these transistors are connected to the output node OUT, and the gates are connected to the two drains of the PMOS transistor P7 and the NMOS transistor N5.

The Schmitt trigger buffer section 33 has hysteresis characteristics. Consequently, when the input signal to the Schmitt trigger buffer section 33 exceeds the threshold voltage, the logic state of the output signal is inverted; then, even when the potential level of the input signal varies slightly, there is still no change in the logic state of the output signal. As a result, it is possible to suppress variation in the output potential of the Schmitt trigger buffer section 33.

For the decoder circuit 32, as the output signal of the noise removing circuit 31 made of the Schmitt trigger buffer section 33 is sent to it, the potential level of the input signal to the decoder circuit 32 is barely influenced by the noise. As shown in FIG. 20, even when the ground for the series-parallel converter 5 and the ground for the other circuit blocks are separated from each other, the decoder circuit 32 is still barely be influenced by the potential variation of the ground of the series-parallel converter 5.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A buffer circuit, comprising:
    a first inverter circuit configured to receive an input signal and output an inverted input signal;
    a second inverter circuit configured to receive the inverted input signal and output an output signal;
    an impedance element connected between an output node of the first inverter circuit and an input node of the second inverter circuit;
    a first conductivity type switching element coupled to an output node of the second inverter circuit and configured to increase potential of the output node of the second inverter circuit when the input signal received at a control electrode of the first conductivity type switching element exceeds a first threshold voltage; and
    a second conductivity type switching element coupled to the output node of the second inverter circuit and configured to decrease potential of the output node of the second inverter circuit when the input signal received at a control electrode of the second conductivity type switching element is lower than a second threshold voltage.

2. The buffer circuit according to claim 1, wherein
    the first conductivity type switching element is a first NMOS transistor that has a drain electrode at a first reference voltage, a source electrode connected to the output node of the second inverter circuit, and a gate electrode that receives the input signal, and
    the second conductivity type switching element is a first PMOS transistor that has a source electrode connected to the output node of the second inverter circuit, a drain electrode at a second reference voltage, and a gate electrode that receives the input signal.

3. The buffer circuit according to claim 2, wherein the second inverter circuit comprises a second PMOS transistor and a second NMOS transistor connected in series between a node at the first reference voltage and an a node at the second reference voltage.

4. The buffer circuit according to claim 3, wherein the lesser of a value obtained by dividing a channel width of the first PMOS transistor by a channel length of the first PMOS transistor and a value obtained by dividing a channel width of the first NMOS transistor by a channel length of the first NMOS transistor is equal to or greater than the lesser of a value obtained by dividing a channel width of the second PMOS transistor by the channel length of the second PMOS transistor and a value obtained by dividing the channel width of the second NMOS transistor by the channel length of the second NMOS transistor.

5. The buffer circuit according to claim 1, further comprising:
    a first pattern layer in which a signal wiring pattern for carrying the input signal is disposed; and
    a second pattern layer, below the first pattern layer, in which a ground wiring pattern is disposed, the ground wiring pattern having a portion disposed such that the portion is interposed between the signal wiring pattern and a substrate disposed below the second pattern layer.

6. The buffer circuit according to claim 5, further comprising:
    a third pattern layer laminated over the first pattern layer, the third pattern layer having a solid pattern disposed so as to substantially cover the signal wiring pattern, the solid pattern being at a ground potential.

7. The buffer circuit according to claim 6, wherein the solid pattern is connected to the ground wiring pattern by a via.

8. The buffer circuit according to claim 1, further comprising:
- a third inverter circuit connected to the output node of the second inverter circuit that inverts the output signal; and
- a capacitor element connected between an output node of the third inverter circuit and a reference voltage node.

9. The buffer circuit according to claim 1, wherein the first inverter circuit is a Schmitt type inverter circuit.

10. A switching controller, comprising:
- a buffer circuit, including:
  - a first inverter circuit configured to receive an input signal and output an inverted input signal;
  - a second inverter circuit configured to receive the inverted input signal and output an output signal;
  - an impedance element connected between an output node of the first inverter circuit and an input node of the second inverter circuit;
  - a first conductivity type switching element coupled to an output node of the second inverter circuit and configured to increase potential of the output node of the second inverter circuit when the input signal received at a control electrode of the first conductivity type switching element exceeds a first threshold voltage; and
  - a second conductivity type switching element coupled to the output node of the second inverter circuit and configured to decrease potential of the output node of the second inverter circuit when the input signal received at a control electrode of the second conductivity type switching element is lower than a second threshold voltage;
- a series-parallel converter configured to receive a clock signal output from the second inverter circuit and convert a serial switch control signal to a parallel switch control signal in accordance with the clock signal;
- a high frequency switching circuit configured to switch a connection between a common terminal and a plurality of terminals; and
- a driver circuit configured to drive the high frequency switching circuit in accordance with the parallel switch control signal.

11. The switching controller of claim 10, further comprising:
- a ground pattern region is formed between a first circuit forming region where the series-parallel converter is formed and a second circuit forming region where the high frequency switching circuit is formed in the same layer.

12. The switching controller of claim 10, wherein the buffer circuit further comprises:
- a third inverter circuit connected to the output node of the second inverter circuit and configured to invert the output signal; and
- a capacitor element connected between an output node of the third inverter circuit and a reference voltage node.

13. The switching controller of claim 10, wherein the first conductivity type switching element is a first NMOS transistor that has a drain electrode at a first reference voltage, a source electrode connected to the output node of the second inverter circuit, and a gate electrode connected to receive the input signal, and
- the second conductivity type switching element is a first PMOS transistor that has a source electrode connected to the output node of the second inverter circuit, a drain electrode at a second reference voltage, and a gate electrode connected to receive the input signal.

14. The switching controller according to claim 10, further comprising:
- a first pattern layer in which a signal wiring pattern carrying the input signal is disposed; and
- a second pattern layer, below the first pattern layer, in which a ground wiring pattern is disposed, a portion of the ground wiring pattern disposed so that the portion is interposed between the signal wiring pattern and a substrate disposed below the second pattern layer.

15. The switching controller according to claim 14, further comprising:
- a third pattern layer laminated over the first pattern layer, the third pattern layer having a solid pattern disposed so as to substantially cover the signal wiring pattern, the solid pattern being at a ground potential.

16. The switching controller of claim 10, further comprising:
- a noise removing circuit between the series-parallel converter and the high frequency switching circuit.

17. The switching controller of claim 16, wherein the noise removing circuit comprises a Schmitt type circuit.

* * * * *